United States Patent [19]
Durlam et al.

[11] Patent Number: 6,153,443
[45] Date of Patent: Nov. 28, 2000

[54] METHOD OF FABRICATING A MAGNETIC RANDOM ACCESS MEMORY

[75] Inventors: Mark Durlam; Gloria Kerszykowski, both of Chandler; Jon M. Slaughter, Tempe; Eugene Chen, Gilbert; Saied N. Tehrani, Tempe; Kelly W. Kyler, Mesa, all of Ariz.; X. Theodore Zhu, Maple Grove, Minn.

[73] Assignee: Motorola, Inc., Schaumburg, Ill.

[21] Appl. No.: 09/216,821

[22] Filed: Dec. 21, 1998

[51] Int. Cl.[7] .................................................. H01L 21/00
[52] U.S. Cl. .................. 438/3; 257/295; 427/127
[58] Field of Search ............................. 438/3, 171, 210, 438/131; 365/171, 173

[56] References Cited

U.S. PATENT DOCUMENTS

| | | | |
|---|---|---|---|
| 5,569,617 | 10/1996 | Yeh et al. | 437/48 |
| 5,804,458 | 9/1998 | Tehrani et al. | 438/3 |
| 5,940,319 | 8/1999 | Durlam et al. | 365/171 |
| 5,956,267 | 9/1999 | Hurst et al. | 365/158 |
| 5,976,713 | 11/1999 | Fuke et al. | 428/692 |
| 6,048,739 | 4/2000 | Hurst et al. | 438/3 |

*Primary Examiner*—Richard Elms
*Assistant Examiner*—Bradley K Smith
*Attorney, Agent, or Firm*—William E. Koch

[57] ABSTRACT

An improved and novel fabrication method for magnetoresistive random access memory (MRAM) is provided. An MRAM device has memory elements and circuitry for managing the memory elements. The circuitry includes transistor (12a), digit line (29), etc., which are integrated on a substrate (11). The circuitry is fabricated first under the CMOS process and then magnetic memory elements (53, 54). A dielectric layer (40, 41) is deposited on the circuit, and trenches (42, 43) are formed in the dielectric layer. A blanket layer (46), which includes magnetic layers (48, 49) and a non-magnetic layer (50) sandwiched by the magnetic layers, is deposited on dielectric layer (41) and in the trenches. Then, the blanket layer outside the trenches is removed and MRAM elements (53, 54) are formed in the trenches.

22 Claims, 3 Drawing Sheets

METHOD OF FABRICATING A MAGNETIC RANDOM ACCESS MEMORY

FIELD OF THE INVENTION

The present invention relates to a method of fabricating a magnetic random access memory (MRAM), and more particularly, to a method of fabricating a magnetic memory element positioned on circuitry for control of the memory element, which is formed under a complementary metal oxide semiconductor (CMOS) process.

BACKGROUND OF THE INVENTION

This application is related to a co-pending application that bears Motorola Ser. No. 09/144,686, entitled "MAGNETIC RANDOM ACCESS MEMORY AND FABRICATING METHOD THEREOF," filed on Aug. 31, 1998, and incorporated herein by reference.

A magnetic memory element has a structure that includes ferromagnetic layers separated by a non-magnetic layer. Information is stored as directions of magnetization vectors in magnetic layers. Magnetic vectors in one magnetic layer, for instance, are magnetically fixed or pinned, while the magnetization direction of the other magnetic layer is free to switch between the same and opposite directions as information that are called "Parallel" and "Antiparallel" states, respectively. In response to Parallel and Antiparallel states, the magnetic memory element represents two different resistances. The resistance has minimum and maximum values when the magnetization vectors of the two magnetic layers point in substantially the same and opposite directions, respectively. Accordingly, a detection of changes in resistance allows an MRAM device to provide information stored in the magnetic memory element.

An MRAM device integrates magnetic memory elements and other circuits, for example, a control circuit for magnetic memory elements, comparators for detecting states in a magnetic memory element, input/output circuits, etc. These circuits are fabricated in the process of CMOS technology in order to lower the power consumption of the MRAM device. The CMOS process requires high temperature steps that exceed 300° C. for depositing dielectric and metal layers and annealing implants, for example.

Magnetic layers employ ferromagnetic material such as CoFe and NiFeCo that requires processing below 300° C. in order to prevent intermixing of magnetic materials caused by high temperatures. Accordingly, magnetic memory elements need to be fabricated at a different stage after CMOS processing.

Magnetic memory elements contain components that are easily oxidized and also sensitive to corrosion. To protect magnetic memory elements from degradation and keep the performance and reliability of the MRAM device, a passivation layer is formed over magnetic memory elements.

In addition, a magnetic memory element includes very thin layers, some of them are tens of angstroms thick. The performance of the magnetic memory element is sensitive to the surface conditions on which magnetic layers are deposited. Accordingly, it is necessary to make a flat surface to prevent the characteristics of an MRAM device from degrading.

Metal lines are employed to produce magnetic fields for writing and/or reading states in a magnetic memory element. Less amount of current is desired to minimize power consumption.

Accordingly, it is a purpose of the present invention to provide an improved MRAM device that prevents a magnetic memory element from thermal degradation while fabricating the device.

It is another purpose of the present invention to provide an improved MRAM device that prevents a magnetic memory element from oxidation and corrosion.

It is a further purpose of the present invention to provide an improved MRAM device that reduces power consumption of the device.

It is a still further purpose of the present invention to provide a method of integrating an improved MRAM device into a CMOS process.

SUMMARY OF THE INVENTION

These needs and others are substantially met through provision of a magnetoresistive random access memory (MRAM) that includes magnetic memory elements on circuitry for controlling operations of magnetic memory elements. First, the circuitry is formed on a substrate under the CMOS process that requires a heat treatment of 300° C. or more. While fabricating the circuitry, conductive lines are also formed, which are used to create magnetic fields for writing and/or reading states in the magnetic memory element. The metal lines are enclosed by high permeability material such as a permalloy layer that facilitates magnetic fields to concentrate on the magnetic memory element. After completion of the circuitry, a surface of a layer including the circuitry is polished by the chemical mechanical polishing (CMP) process that produces a flat surface on the layer including the circuitry, then a dielectric layer is deposited on the surface. A mask is formed on the dielectric layer and the dielectric layer is etched down to make a trench. A blanket layer, which forms a magnetic memory layer, is deposited over the dielectric layer and in the trench before an electrically conductive layer is deposited on the blanket layer. Next, the blanket layer on the dielectric layer and the electrically conductive layer outside the trench are removed by a chemical mechanical polishing (CMP) technique, which provides a flat surface. This removal of the blanket layer and the electrically conductive layer provides a magnetic memory element in the trench. After forming the magnetic memory element. An electrically conductive line is formed on the flat surface, which is coupled to the magnetic memory element through the electrically conductive layer in the trench. Fabrication of the magnetic memory element after the CMOS process improves the performance and reliability of the magnetic memory element and avoids thermal degradation of the magnetic memory element.

DETAILED DESCRIPTION OF THE PREFERRED EMBODIMENTS

FIGS. 1–9 illustrate cross-sectional views of sequential steps for fabrication of a magnetoresistive random access memory (MRAM) that includes transistors for controlling magnetic memory elements.

Figure 1:
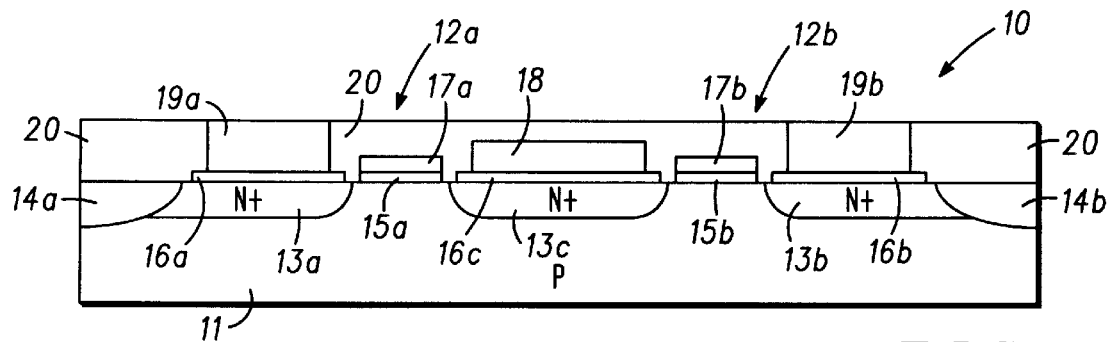
FIGS. 1–9 show cross-sectional views of sequential steps in the formation of an MRAM device.

Referring specifically to FIG. 1, a cross-sectional view of a partially fabricated an MRAM device 10 is illustrated, wherein device 10 includes a P-type silicon substrate 11. Device 10 has circuitry, for instance, NMOS switching transistors 12a and 12b that are fabricated under the well known CMOS process. Other circuit elements, for example, input/output circuit, data/address decoder, comparators, etc. may be contained in the MRAM device, however they are omitted from the drawings for simplicity.

First of all, substrate 11 is provided to pattern windows for N+ regions 13a, 13b and 13c and implant the source/drain regions 13a, 13b and 13c. Then isolation regions 14a and 14b are formed for separation. Next, polysilicon layers 15a and 15b are deposited on substrate 11 for forming gate regions. Metal layers 16a and 16b are deposited on N+ regions 13a and 13b for source electrodes while metal layer 16c is deposited on N+ region 13c for a drain electrode. Further, metal layers 17a and 17b for gate electrodes are deposited on poly-silicon layers 15a and 15b, respectively. A conductor line 18 is formed on metal layer 16c, which provides a sense current to magnetic memory elements through transistors 12a and 12b. A magnetic memory element will be explained hereinafter. Plug conductors 19a and 19b, which work for conducting a sense current to magnetic memory elements, are formed on and interconnected to metal layers 16a and 16b, respectively. All circuit elements of an MRAM device, except magnetic memory elements, digit lines and word lines, are integrated on substrate 11 before dielectric material 20 is filled. Then, A surface of device 10 is polished by the CMP (Chemical Mechanical Polishing) process, which includes the top surface of dielectric layer 20 is flat.

Figure 2:
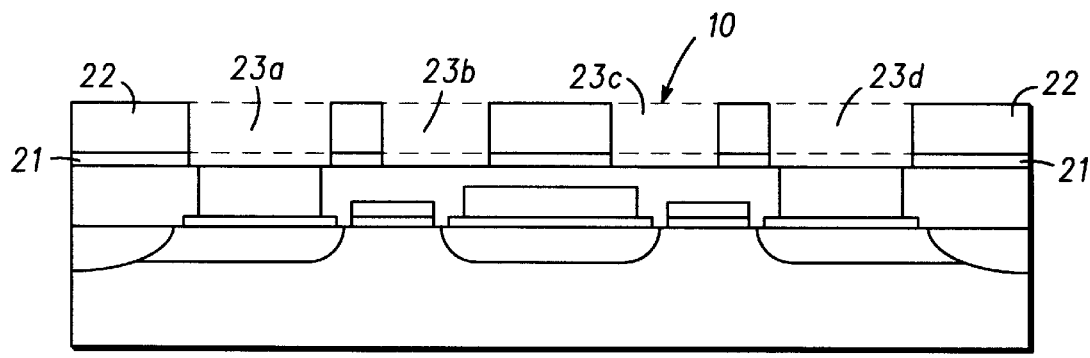

After partially fabricated MRAM device 10 has been completed as illustrated in FIG. 1, magnetic memory elements are formed on device 10 along with digit lines and word lines. As shown in FIG. 2, an etch stop layer 21, which employs material such as AlN, AlO and SiN, is deposited on the surface of device 10. Instead of etch stop layer 21, other technique such as endpoint etches may be used. A silicon dioxide ($SiO_2$) layer 22 is deposited with a thickness of 4,000–6,000 Å on etch stop layer 21.

In the next step, a mask layer is deposited on silicon dioxide layer 22 and is patterned and defined as an etching mask using a standard lithography technique. As shown in FIG. 2, silicon dioxide 20 is etched away to etch stop layer 21 that makes trenches 23a–23d in silicon dioxide layer 22, and then the exposed etch stop layer is removed from trenches 23a–23d.

Figure 3:
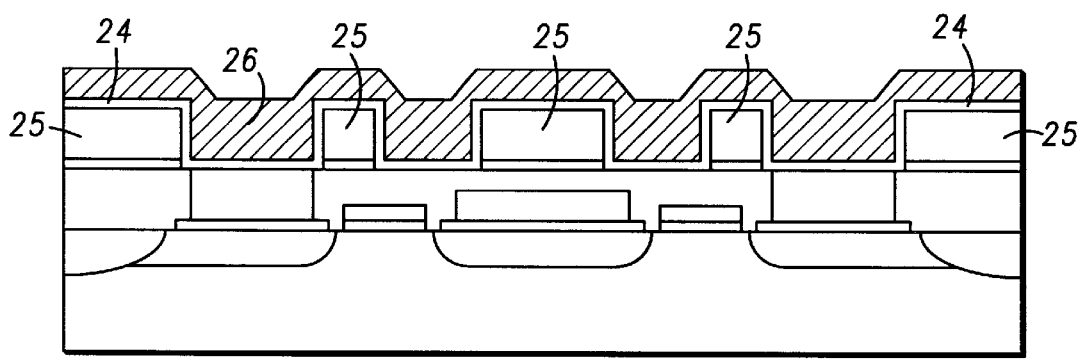
Figure 4:
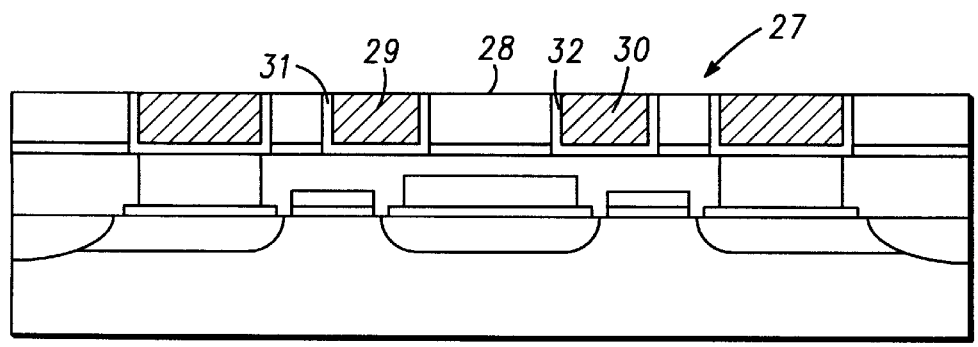

Referring to FIG. 3, a thin field focusing layer 24 having a high permeability such as nickel-iron is deposited overlying trenches 23a–23d and a silicon dioxide dielectric layer 25. High permeability layer 24 is 100–500 Å thick. In order to improve adhesion of field focusing layer 24 and to provide a barrier for Ni or Fe diffusion into dielectric layer of Ta or TaN or other such materials could be added between field focusing layer 24 and dielectric layer 25. A conductor metal layer 26 is then deposited on field focusing layer 24. As a conductor metal, aluminum, aluminum alloys, copper, and copper alloys are employed. In order to improve adhesion of field focusing layer 24 and to provide a barrier for Ni or Fe diffusion into the conductor and/or dielectric a layer of Ta or TaN or such materials could be added between field focusing layer 24 and conductor layer 26. After depositing metal layer 26, the metal bulged out of trenches 23a–23d and the high permeability layer 24 on silicon dioxide layer 25 is removed from a top surface by the CMP process so that, as shown in FIG. 4, a partially fabricated MRAM device 27 having a flat top surface 28 is produced.

Partially fabricated MRAM device 27 includes torque or digit lines 29 and 30, on which magnetic memory elements are formed. Digit lines 29 and 30 carry a current to generate a magnetic field that causes magnetic memory elements to store states. Digit lines 29 and 30 are enclosed by high permeability layers 31 and 32 excluding a portion on the top surface 28. Layer 31, for example, shields the magnetic field generated by current flowing in digit line 29 from magnetic flux leakage, and facilitates the magnetic field to focus on a magnetic memory element placed on digit line 29 through top surface 28 not covered by layer 31.

Figure 5:
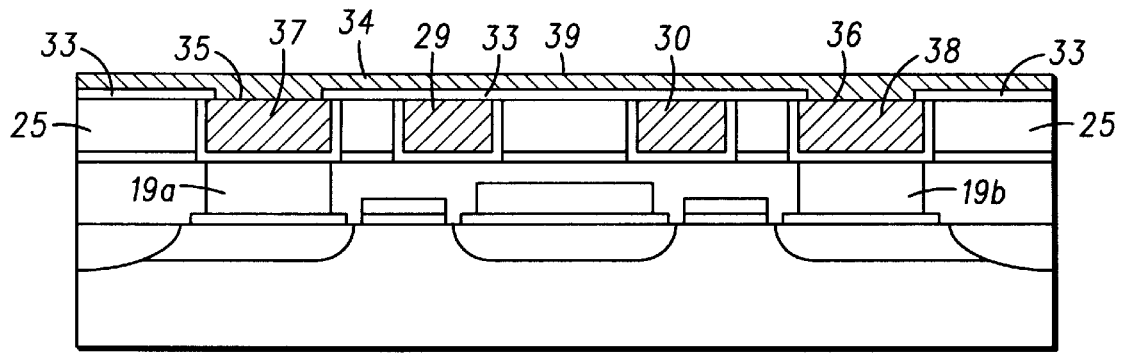

Referring to FIG. 5, a dielectric layer 33 is deposited over digit lines 29 and 30 and dielectric layer 25, and a conductor layer 34 is deposited over dielectric layer 33. Dielectric layer 33 is placed between digit lines 29 and 30 and conductor layer 34 to provide electrical isolation therebetween. Dielectric layer 33 is partially etched to make windows 35 and 36 on metal conductors 37 and 38 that are employed to electrically connect plug conductors 19a and 19b to conductor layer 34. After making windows 35 and 36, conductor layer 34 is deposited with a thickness of around 500 Å over dielectric layer 33 and metal conductors 37 and 38. In order to form magnetic memory elements on conductor layer 34, a top surface of conductor layer 34 needs to be smooth and planar because magnetic memory elements have very thin films, thereby a good condition for a magnetic memory element is attained. In order to planarize, surface 39 is polished and formed by a planarizing process such as the CMP process.

Figure 6:
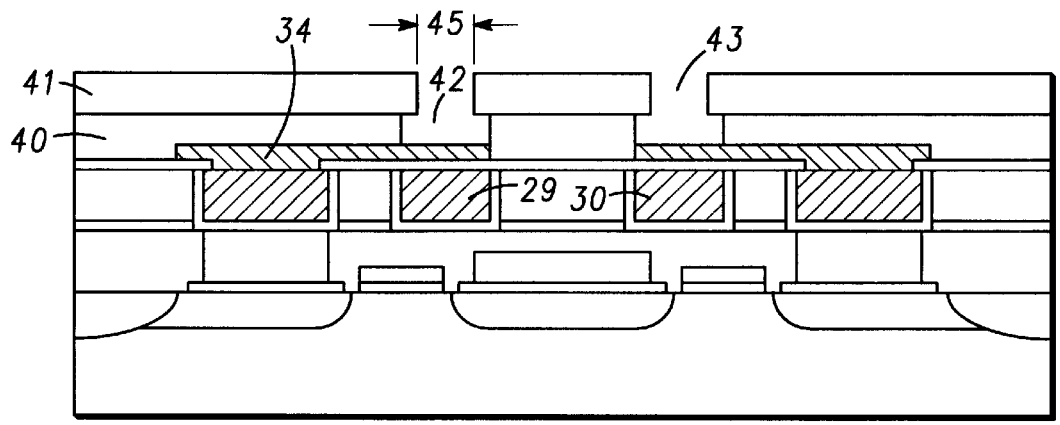

Next, referring to FIG. 6, a dielectric layer 40 is deposited on conductive layer 34. Silicon nitride (SiN) or aluminum nitride (AlN) are employed for dielectric layer 40, typically having a thickness of 500 Å. Furthermore, another dielectric layer 41 such as silicon oxide ($SiO_2$) is deposited on dielectric layer 40 with a thickness of 2,000–5,000 Å. After depositing dielectric layers 40 and 41, an etch mask (not shown) is formed on layer 41 to make a trench 42 on digit line 29 and a trench 43 on digit line 30. According to the etch mask, dielectric layer 41 is etched down to dielectric layer 40, which serves as an etch stop layer. Then, dielectric layer 40 is removed using an isotropic technique, which creates an undercut of dielectric layer 41. The undercut prevents a continuous deposition on the vertical side wall, thus separating the deposition naturally without the use of chemical etchants or physical sputtering. A width of the trench indicated by an arrow 45 is typically 0.2–0.3 µm.

Figure 7:
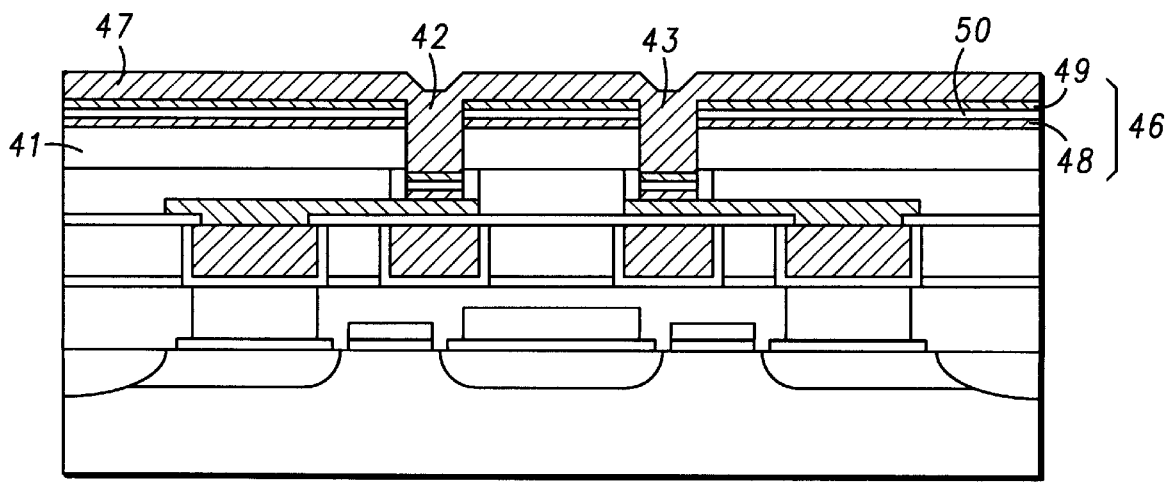

Referring to FIG. 7, a blanket layer 46 and an electrically conductive layer 47 are deposited on dielectric layer 41 and in undercut trenches 42 and 43. Blanket layer 46 includes three layers 48–50, which are deposited by either plasma vapor deposition (PVD) or ion beam deposition (IBD) techniques. Bottom and top magnetic layers 48 and 49 utilize magnetic material such as CoFe and NiFeCo while middle layer 50 employs a non-magnetic material such as $Al_2O_3$ or Cu, which is sandwiched with layers 48 and 49. Layer 48, for example, serves as a hard magnetic layer, magnetization in which is pinned or fixed, whereas magnetization directions in top magnetic layer 49 are free. Non-magnetic layer 50 is formed by the following methods. An aluminum film is deposited over bottom magnetic layer 48, then the aluminum film is oxidized by an oxidation source, such as RF oxygen plasma. As another method, aluminum is deposited together with oxide on layer 48, and then oxidation is carried out in oxygen ambient either heated or unheated. The layers for the magnetic memory element are very thin with magnetic layers 48 and 49 varying from 20 to 200 Å and non-magnetic layer 50 from 10 to 30 Å. Accordingly, blanket layer 46 is typically 400–500 Å thick. After forming blanket layer 46, electrically conductive layer 47 is deposited on blanket layer 46. In this embodiment, layer 47 is formed of Co or Al.

Figure 8:
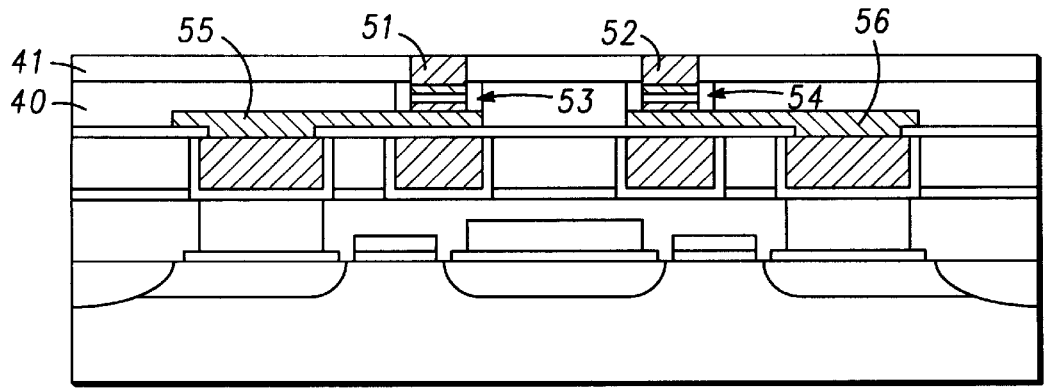

After depositing layer 47, layers 48–50 on dielectric layer 41 and layer 47 outside trenches 42 and 43 are removed, as shown in FIG. 8. The removal is carried out by the CMP process, which provides a very planar surface on dielectric layer 41 and electrically conductive vias 51 and 52. Layers 48–50 left in trenches 42 and 43 form magnetic memory elements 53 and 54, which have ohmic contacts with conductive vias 51 and 52 and conductor layers 55 and 56, respectively.

Under the above process, blanket layer 46 on dielectric layer 41 is polished and removed away and remaining magnetic layers in trenches 42 and 43 are employed for memory elements. It, however, is possible to use magnetic layers on dielectric layer 41 as memory elements. In this structure, a dielectric layer instead of electrically conductive layer 47 is deposited overlying blanket layer 46, and the dielectric layer on dielectric layer 41 is polished down to magnetic layer 49 by the CMP process. The dielectric layer in trenches 42 and 43 helps magnetic memory elements to maintain an electrical isolation thereamong. An electrical connection to transistor 12a, for example, is formed in dielectric layers 40 and 41 (not shown).

Figure 9:
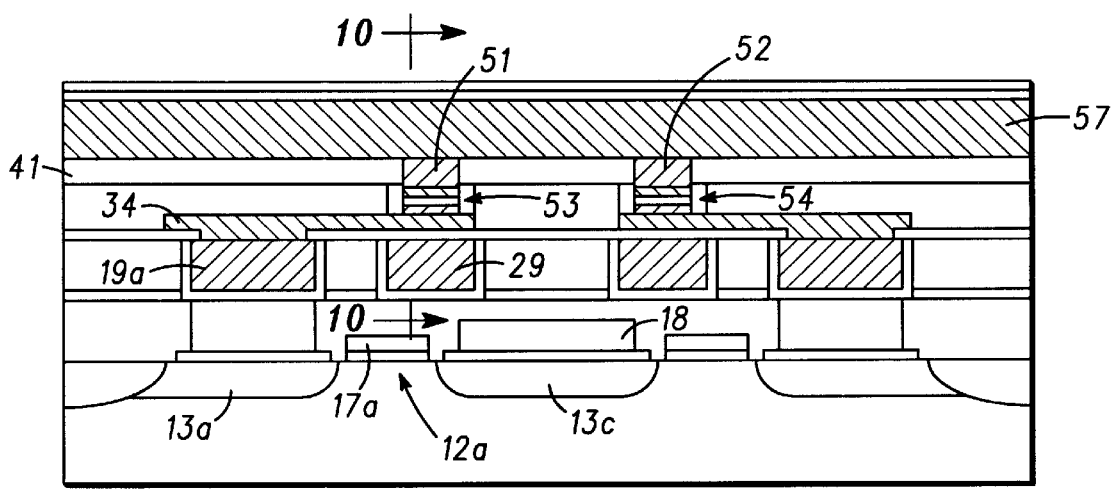
Figure 10:
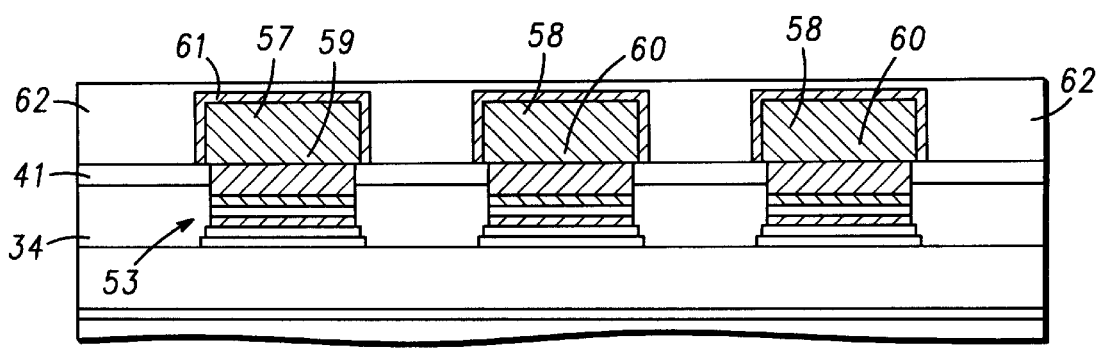
FIG. 10 shows a cross-sectional view as seen from the line 10—10 in FIG. 9.

FIG. 9 illustrates a cross sectional view for forming a bit line 57, and FIG. 10 is a partial cross-sectional view through digit line 29, magnetic memory element 53, and bit line 57 indicated by arrows 10-10 in FIG. 9. After magnetic memory elements 53 and 54 are formed as shown in FIG. 8, a dielectric layer is deposited on dielectric layer 41 and conductive vias 51 and 52. The dielectric layer is patterned for forming bit lines 57 and 58 and etched down to a top surface of dielectric layer 41 and conductive vias 51 and 52. Next, metal material such as Al and Cu is deposited in trenches 59 and 60 to form bit lines 57 and 58. The dielectric layer overlying bit lines 57 and 58 is removed and a field focusing, high permeability layer 61 such as NiFe is deposited on bit lines 57 and 58 and dielectric layer 41. Then, a dielectric layer 62 is deposited overlying field focusing layer 61.

Referring to FIG. 9 again, in order to read information stored in magnetic memory element 53, for instance, transistor 12a is turned on to supply a sense current thereto; a turn-on signal is applied to gate electrode 17a. Transistor 12a allows the sense current to flow from conductor line 18 through N+ regions 13c and 13a, plug conductor 19a, conductor layer 34, and element 53 to bit line 57. A magnetic resistance across element 53 changes according to states therein. A voltage drop over element 53 is sensed and compared to a reference voltage to determine states stored in element 53. The comparison is carried out by a comparator, for example, which is not shown in FIG. 9.

In a write operation to magnetic memory element 53, for instance, a digit current and a bit current are provided to digit line 29 and bit line 57, respectively. A combination magnetic field produced by bit and digit currents is applied to element 53. Magnetization directions of the combination magnetic field determines states to be stored in element 53.

Thus, an improved and novel fabrication method for a magnetic memory element is disclosed. Circuitry for controlling magnetic memory element is fabricated first under the process that requires a high temperature processing, for example the CMOS process, and then the magnetic memory elements are formed on the circuitry. Accordingly, magnetic memory elements are integrated with circuit elements fabricated by the CMOS process and are prevented from degradation of metal composition caused by high temperatures. Further, because digit and bit lines are enclosed by a permalloy layer, magnetic fields generated by digit and bit currents are shielded and focused on magnetic memory elements, and less current is required.

What is claimed is:

1. A method of fabricating a random access memory having a magnetic memory cell and circuitry for controlling operations of the magnetic memory cell, the method comprising the steps of:

providing a substrate on which the magnetic memory cell and the circuitry are formed;

forming the circuitry on the substrate;

depositing a dielectric layer on the circuitry;

forming a trench in the dielectric layer; and forming the magnetic memory cell in the trench, the magnetic memory cell being coupled to the circuitry.

2. The method of fabricating the random access memory as claimed in claim 1 wherein the step of depositing the dielectric layer includes a step of depositing a first dielectric layer on the circuitry and a step of depositing a second dielectric layer on the first dielectric layer.

3. The method of fabricating the random access memory as claimed in claim 1 wherein the step of forming the magnetic memory cell includes steps of:

depositing a blanket layer over the dielectric layer and in the trench;

depositing an electrically conductive layer overlying the blanket layer; and removing the electrically conductive layer and the blanket layer which are outside of the trench.

4. The method of fabricating the random access memory as claimed in claim 3 wherein the step of depositing the blanket layer includes steps of:

depositing a first magnetic layer;

depositing a non-magnetic layer on the first magnetic layer; and depositing a second magnetic layer on the non-magnetic layer.

5. The method of fabricating the random access memory as claimed in claim 3 wherein the step of removing the electrically conductive layer and the blanket layer includes a step of polishing the electrically conductive layer and the blanket layer by a chemical mechanical polishing (CMP) technique.

6. The method of fabricating the random access memory as claimed in claim 1 wherein the step of forming the circuitry includes a step of forming a first electrically conductive line adjacent the magnetic memory cell.

7. The method of fabricating the random access memory as claimed in claim 6 wherein the step of forming the first electrically conductive line includes a step of forming a flux concentrating layer around the first electrically conductive line except a surface toward the magnetic memory cell.

8. The method of fabricating the random access memory as claimed in claim 6 further including a step of forming a second electrically conductive line that is perpendicular to the first electrically conductive line and is electrically coupled to the magnetic memory cell.

9. The method of fabricating the random access memory as claimed in claim 8 wherein the step of forming the second electrically conductive line includes a step of forming a flux concentrating layer around the second electrically conductive line except a surface toward the magnetic memory cell.

10. The method of fabricating the random access memory as claimed in claim 1 wherein the step of forming the magnetic memory cell includes steps of:

depositing a first magnetic layer;

depositing a non-magnetic layer on the first magnetic layer; and depositing a second magnetic layer on the non-magnetic layer.

11. The method of fabricating the random access memory as claimed in claim 10 wherein the step of depositing a non-magnetic layer includes a step of forming a tunneling junction between the first magnetic layer and the second magnetic layer.

12. The method of fabricating the random access memory as claimed in claim 1 wherein the step of forming the circuitry on the substrate includes a step of fabricating the circuitry under a process for a complimentary metal oxide semiconductor (CMOS).

13. The method of fabricating the random access memory as claimed in claim 1 wherein the step of forming the magnetic memory cell includes steps of:

depositing a blanket layer over the dielectric layer and in the trench;

depositing a dielectric layer overlying the blanket layer and in the trench; and removing the dielectric layer on the blanket layer.

14. The method of fabricating the random access memory as claimed in claim 13 wherein the step of depositing the blanket layer includes steps of:

depositing a first magnetic layer;

depositing a non-magnetic layer on the first magnetic layer; and depositing a second magnetic layer on the non-magnetic layer.

15. The method of fabricating the random access memory as claimed in claim 13 wherein the step of removing the dielectric layer includes a step of polishing the dielectric layer by a chemical mechanical polishing (CMP) technique.

16. A method of fabricating a random access memory having a magnetic memory cell and circuitry for controlling operations of the magnetic memory cell, the method comprising the steps of:

providing a substrate on which the magnetic memory cell and the circuitry are formed;

forming the circuitry on the substrate including a first electrically conductive line;

depositing a dielectric layer on the circuitry;

isotropicly etching the dielectric layer to form an undercut trench on the first electrically conductive line;

depositing a blanket layer over the dielectric layer and in the undercut trench;

depositing an electrically conductive layer overlying the blanket layers;

removing the electrically conductive layer outside of the undercut trench and the blanket layers on the dielectric layer; and forming a second electrically conductive line that is perpendicular to the first electrically conductive line and is electrically coupled to the magnetic memory cell through the electrically conductive layer on the magnetic memory cell.

17. The method of fabricating the random access memory as claimed in claim 16 wherein the step of forming the circuitry includes a step of forming a flux concentrating layer around the first electrically conductive line except a surface toward the magnetic memory cell.

18. The method of fabricating the random access memory as claimed in claim 16 wherein the step of depositing a dielectric layer includes a step of depositing a first dielectric layer on the circuitry and a step of depositing a second dielectric layer on the first dielectric layer.

19. The method of fabricating the random access memory as claimed in claim 16 wherein the step of forming the second electrically conductive line includes a step of forming a flux concentrating layer around the second electrically conductive line except a surface toward the magnetic memory cell.

20. The method of fabricating the random access memory as claimed in claim 16 wherein the step of depositing the blanket layer includes steps of:

depositing a first magnetic layer;

depositing a non-magnetic layer on the first magnetic layer; and depositing a second magnetic layer on the non-magnetic layer.

21. The method of fabricating the random access memory as claimed in claim 20 wherein the step of depositing a non-magnetic layer includes a step of forming a tunneling junction between the first magnetic layer and the second magnetic layer.

22. The method of fabricating the random access memory as claimed in claim 20 wherein the step of forming the circuitry on the substrate includes a step of fabricating the circuitry under a process for a complimentary metal oxide semiconductor (CMOS).

* * * * *

UNITED STATES PATENT AND TRADEMARK OFFICE
CERTIFICATE OF CORRECTION

PATENT NO.    : 6,153,443
DATED         : November 28, 2000
INVENTOR(S)   : Durlam et al.

It is certified that error appears in the above-identified patent and that said Letters Patent is hereby corrected as shown below:

Column 1,
Line 3, after the Title, please add as a new first paragraph the following paragraph:

-- This invention was made with Government support under Agreement No. MDA972-96-3-0016 awarded by DARPA. The Government has certain rights in the invention. --

Signed and Sealed this

Nineteenth Day of August, 2003

JAMES E. ROGAN
*Director of the United States Patent and Trademark Office*